United States Patent
Lee et al.

(10) Patent No.: US 9,243,904 B2
(45) Date of Patent: Jan. 26, 2016

(54) PROXIMITY SENSOR AND PROXIMITY SENSING METHOD USING LIGHT QUANTITY OF REFLECTION LIGHT

(71) Applicant: SAMSUNG ELECTRONICS CO., LTD., Suwon-si (KR)

(72) Inventors: Jun Haeng Lee, Hwaseong-si (KR); Hyun Surk Ryu, Hwaseong-si (KR); Kyoobin Lee, Seoul (KR); Tobi Delbruck, Zurich (CH); Raphael Berner, Zurich (CH)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/940,349

(22) Filed: Jul. 12, 2013

(65) Prior Publication Data

US 2014/0022528 A1    Jan. 23, 2014

(30) Foreign Application Priority Data

Jul. 18, 2012 (KR) .......................... 10-2012-0078408

(51) Int. Cl.
| | |
|---|---|
| *G01C 3/08* | (2006.01) |
| *G01C 3/02* | (2006.01) |
| *G01S 17/02* | (2006.01) |

(Continued)

(52) U.S. Cl.
CPC ................ *G01C 3/02* (2013.01); *G01S 17/026* (2013.01); *G06F 3/011* (2013.01); *H03K 17/941* (2013.01); *H03K 2217/94108* (2013.01); *H03K 2217/94116* (2013.01)

(58) Field of Classification Search
CPC ...... G01S 17/026; G01C 3/02; H03K 17/941; H03K 2217/94108; H03K 2217/94116; G06F 3/011
USPC ................ 356/3.01–3.16, 4.01–4.1; 702/159
See application file for complete search history.

(56) References Cited

U.S. PATENT DOCUMENTS

| | | | | |
|---|---|---|---|---|
| 5,162,861 A | * | 11/1992 | Tamburino et al. .......... 356/5.05 |
| 6,144,366 A | * | 11/2000 | Numazaki et al. ............ 345/156 |
| 6,250,601 B1 | * | 6/2001 | Kolar et al. ............... 251/129.04 |

(Continued)

FOREIGN PATENT DOCUMENTS

| | | |
|---|---|---|
| EP | 1 410 755 A1 | 4/2004 |
| JP | 2010-127635 A | 6/2010 |

(Continued)

OTHER PUBLICATIONS

"Proximity/Ambient Light Sensor with PWM Output", Silicon Labs, p. 2, 11, 2010.*

(Continued)

*Primary Examiner* — Luke Ratcliffe
*Assistant Examiner* — Assres H Woldemaryam
(74) *Attorney, Agent, or Firm* — Sughrue Mion, PLLC (57) ABSTRACT

A proximity sensor and proximity sensing method using a change in light quantity of a reflected light are disclosed. The proximity sensor may include a quantity change detection unit which detects a change in a quantity of reflected light which is output light which has been reflected by an object, where an intensity of the output light changes, and a proximity determination unit which determines a proximity of the object to the quantity change detection unit based on a change in the intensity of the output light and the detected change in the quantity of the reflected light.

24 Claims, 6 Drawing Sheets

(51) Int. Cl.
*H03K 17/94* (2006.01)
*G06F 3/01* (2006.01)

(56) References Cited

U.S. PATENT DOCUMENTS

| | | | |
|---|---|---|---|
| 7,645,974 B2 * | 1/2010 | Ikeno et al. | 250/205 |
| 7,714,265 B2 | 5/2010 | Fadell et al. | |
| 7,728,269 B2 | 6/2010 | Lichtsteiner et al. | |
| 7,907,061 B2 | 3/2011 | Lin et al. | |
| 8,294,879 B2 * | 10/2012 | Silny et al. | 356/4.01 |
| 8,311,769 B2 * | 11/2012 | Yuen et al. | 702/160 |
| 8,547,530 B2 * | 10/2013 | Tan et al. | 356/4.01 |
| 8,625,080 B2 * | 1/2014 | Heizmann et al. | 356/5.01 |
| 2002/0118352 A1 * | 8/2002 | Ohzu et al. | 356/5.04 |
| 2004/0210155 A1 * | 10/2004 | Takemura et al. | 600/534 |
| 2008/0158172 A1 | 7/2008 | Hotelling et al. | |
| 2008/0212066 A1 * | 9/2008 | Waslowski et al. | 356/3.02 |
| 2011/0026770 A1 * | 2/2011 | Brookshire | 382/103 |

FOREIGN PATENT DOCUMENTS

| | | |
|---|---|---|
| KR | 10-2009-0006543 A | 1/2009 |
| KR | 10-2010-0090319 A | 8/2010 |
| KR | 10-2011-0081075 A | 7/2011 |
| KR | 10-2012-0016015 A | 2/2012 |
| WO | 99/04283 A1 | 1/1999 |

OTHER PUBLICATIONS

Communication, dated Aug. 21, 2013, issued by the European Patent Office in counterpart European Patent Application No. 13176770.9.

* cited by examiner

FIG. 2

Case 1

Case 2

FIG. 3

Case 1

Case 2

Case 3

PROXIMITY SENSOR AND PROXIMITY SENSING METHOD USING LIGHT QUANTITY OF REFLECTION LIGHT

CROSS-REFERENCE TO RELATED APPLICATION

This application claims priority from Korean Patent Application No. 10-2012-0078408, filed on Jul. 18, 2012, in the Korean Intellectual Property Office, the disclosure of which is incorporated herein by reference in its entirety for all purposes.

BACKGROUND

1. Field

The following description relates to a proximity sensor and a proximity sensing method using a quantity change of a reflected light, and more particularly, to a proximity sensor and a proximity sensing method that determine proximity of an object by a quantity change detection unit using a light source that varies an intensity of an output light.

2. Description of the Related Art

A technology has been developed for recognizing motions of a user by detecting a change in light quantity which varies according to the motions of a user.

Since this technology detects the change in light quantity without measuring a value of the light quantity, when the user is not moving, a distance between the user and a sensor cannot be measured.

A proximity sensor determines the proximity of a user by measuring a distance with respect to the user. Therefore, a proximity sensor does not recognize motions of the user.

Accordingly, there is a demand for a sensor capable of recognizing motions of a user while also determining the proximity of the user who is not moving.

SUMMARY

According to an aspect of an exemplary embodiment, a proximity sensor includes a quantity change detection unit which detects a change in quantity of a reflected light which is an output light, of which intensity changes, reflected by an object; and a proximity determination unit which determines proximity of the object using a change in intensity of the output light and the change in quantity of the reflected light.

The proximity determination unit may determine proximity of the object using an occurrence number of events based on the change in quantity for a predetermined time from a time when the change in intensity of the output light occurs.

The proximity determination unit may determine proximity of the object using a temporal distribution pattern of events based on the change in quantity and a time when the change in intensity of the output light occurs.

The proximity determination unit may determine proximity of the object using a difference between a time when the events most frequently occurs in the temporal distribution pattern and the time when the change in intensity of the output light occurs.

The quantity change detection unit may detect the change in quantity related to a motion of the object when the light source does not output the output light of which the quantity changes.

The proximity sensor may further include a motion recognition unit which recognizes a motion of the object using the change in quantity related to the motion of the object.

The motion recognition unit may recognize the motion of the object using an occurrence number of events based on the change in quantity related to the motion of the object.

The motion recognition unit may recognize the motion of the object using an interval of events based on the change in quantity related to the motion of the object.

The motion recognition unit may recognize the motion of the object using an occurrence direction of events based on the change in quantity related to the motion of the object.

The motion recognition unit may recognize the motion of the object using a type of events based on the change in quantity related to the motion of the object.

According to an aspect of another exemplary embodiment, a proximity sensing method includes detecting a change in quantity of a reflected light which is an output light of which intensity changes reflected by an object; and a quantity change detection unit which detects a change in quantity of a reflected light which is an output light, of which intensity changes, reflected by an object; and determining proximity of the object using a change in intensity of the output light and the change in quantity of the reflected light.

Other exemplary features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

The following detailed description is provided to assist the reader in gaining a comprehensive understanding of the methods, apparatuses, and/or systems described herein. Accordingly, various changes, modifications, and equivalents of the methods, apparatuses, and/or systems described herein will be suggested to those of ordinary skill in the art. The progression of processing steps and/or operations described is an example; however, the sequence of and/or operations is not limited to that set forth herein and may be changed as is known in the art, with the exception of steps and/or operations necessarily occurring in a particular order. In addition, respective descriptions of well-known functions and constructions may be omitted for increased clarity and conciseness.

FIG. 1 is a diagram illustrating a configuration of a proximity sensor 100 according to an exemplary embodiment.

The proximity sensor 100 may estimate a distance between an object 102 and the proximity sensor 100 using a change in the quantity of output light from the light source 101 which has been reflected from the object 102.

Figure 1:
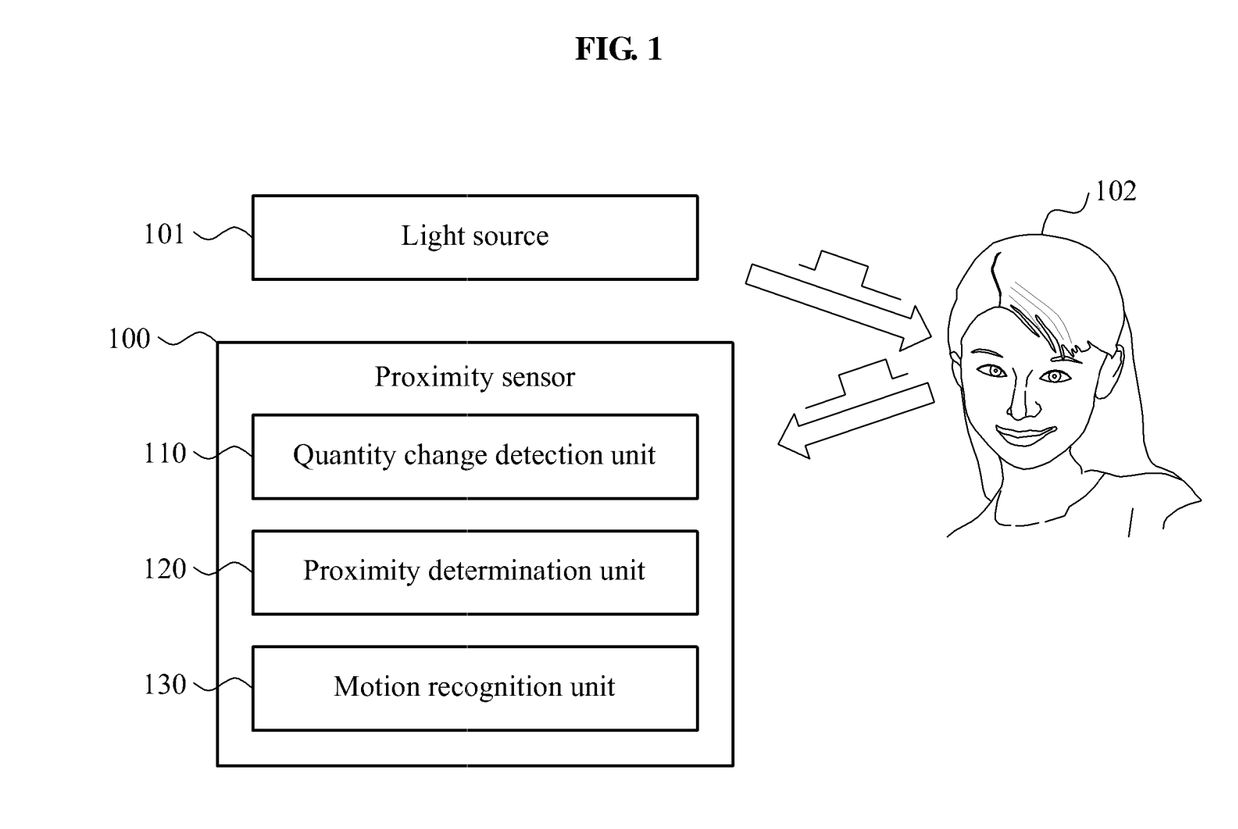
FIG. 1 is a diagram illustrating a configuration of a proximity sensor according to an exemplary embodiment.

Referring to FIG. 1, the proximity sensor 100 may include a quantity change detection unit 110, a proximity determination unit 120, and a motion recognition unit 130.

The quantity change detection unit 110 may detect a change in the quantity of the reflected light which is the output light of a light source 101 reflected from the object 102. Here, the object 102 may be any one of a user and an object.

The change in the quantity of light may be an increase or a decrease in the light being received by the proximity sensor 100 according to the distance between the object 102 and the proximity sensor 100.

For example, as the distance between the proximity sensor 100 and the object 102 decreases, a proportion of the output light reflected by the object and receivable by the quantity change detection unit 110 may be increased.

Conversely, as the distance between the proximity sensor 100 and the object 102 increases, the proportion of the output light reflected by the object and receivable by the quantity change detection unit 110 may be decreased.

That is, the quantity of the reflected light received by the quantity change detection unit 110 may vary according to the distance between the object 102 and the proximity sensor 100.

The change in quantity of the reflected light according to the distance between the object 102 and the proximity sensor 100 will be described in detail with reference to FIG. 3.

Figure 3:
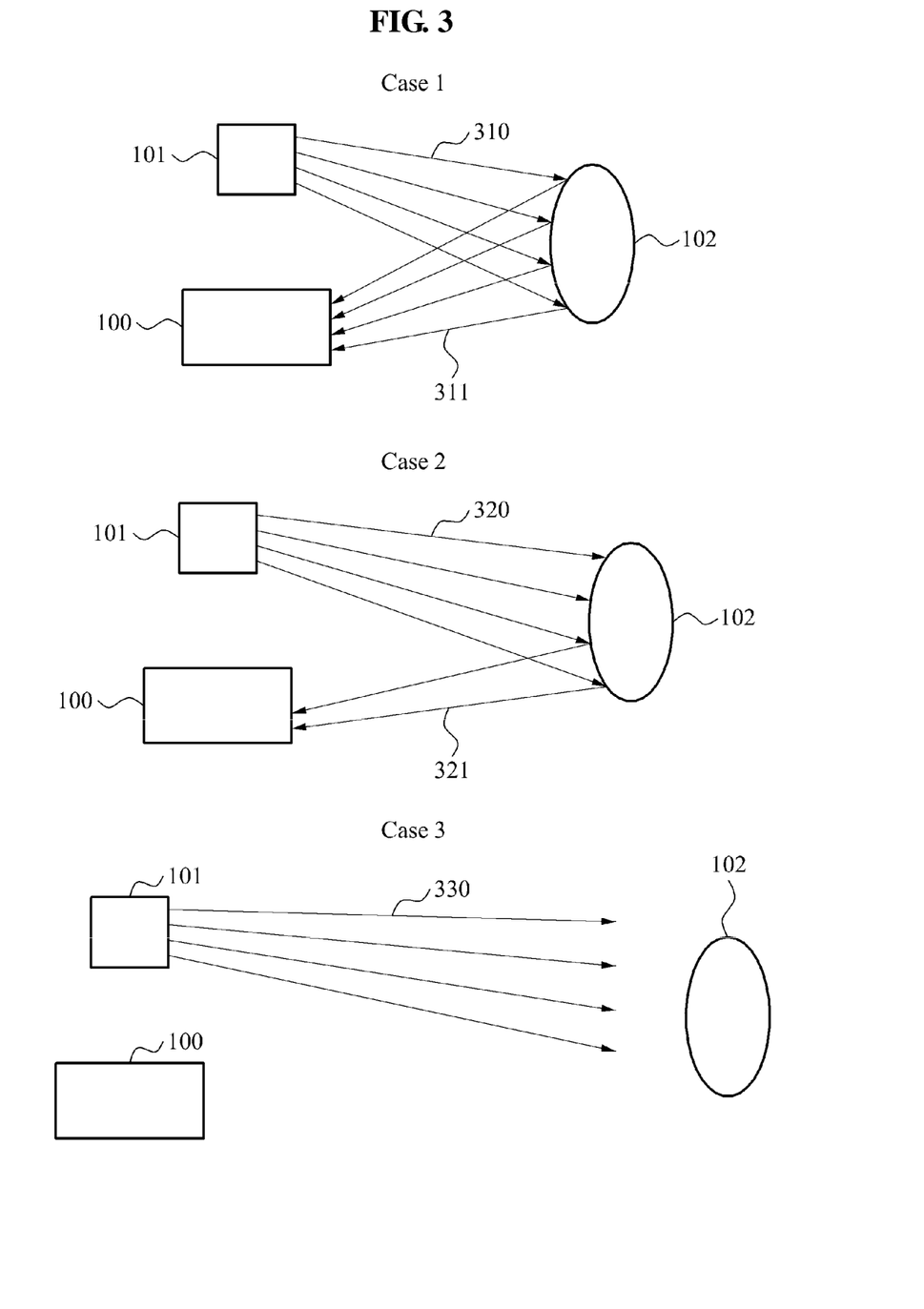
FIG. 3 is a diagram illustrating operational processes according to a distance between a proximity sensor and an object, according to an exemplary embodiment.

As shown in FIG. 3, the quantity of the reflected light received by the quantity change detection unit 110 may vary according to the motion of the object 102 or the intensity of the output light. For example, when the object 102 approaches the proximity sensor 100, the proportion of the output light which is reflected and received by the quantity change detection unit 110 may be increased. However, when the object 102 does not move, any change in the light quantity detected by the quantity change detection unit 110 is not due to a movement of the object 102. However, the light source 101 may change the intensity of the output light, so that the quantity change detection unit 110 may detect a change in quantity of the reflected light although the object 102 does not move. Thus, the quantity change detection unit 110 may detect a change in the quantity of the reflected light corresponding to a change in the intensity of the output light.

Figure 2:
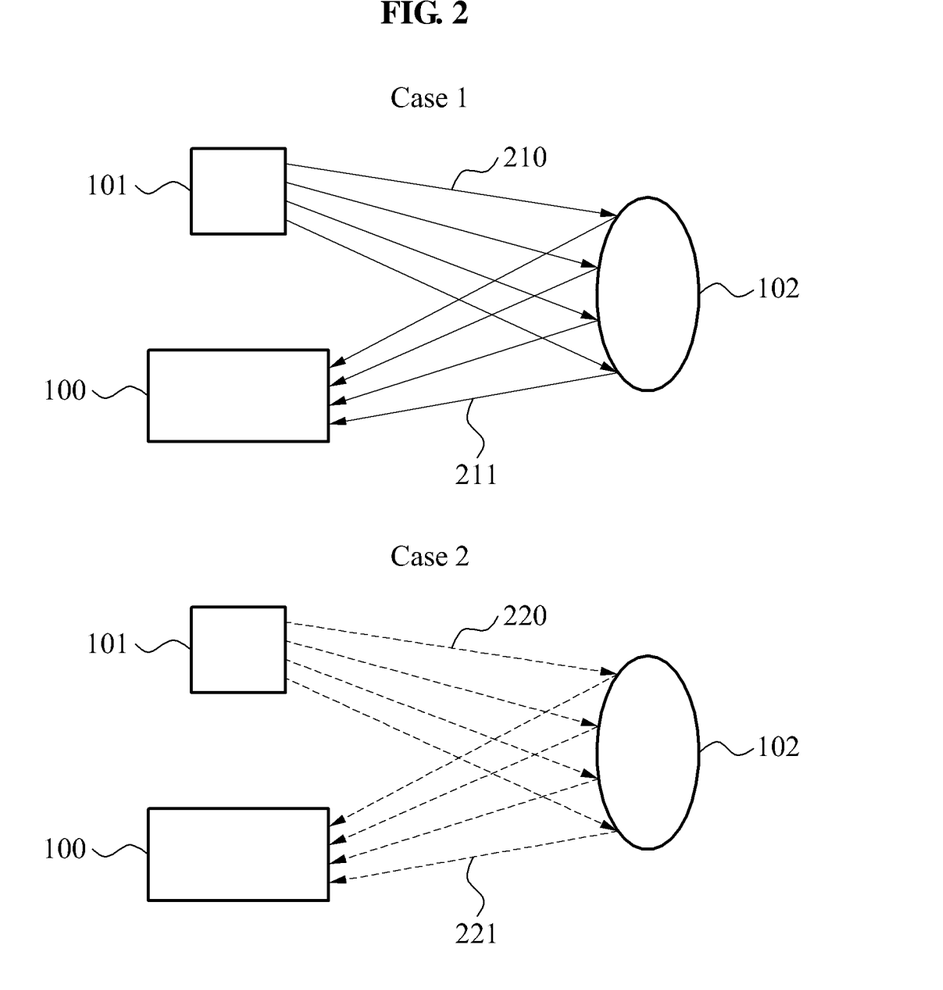
FIG. 2 is a diagram illustrating operational processes of a proximity sensor according to an exemplary embodiment.

The change in the quantity of the reflected light according to the change in the intensity of the output light is illustrated in FIG. 2.

Additionally, as discussed above, the quantity change detection unit 110 may detect a change in the intensity of reflected light related to a motion of the object 102. The object 102 may include any one of a body part of the user, such as a hand, and an object controlled by the user.

A change in an intensity related to a motion of the object 102 may refer to an increase or decrease in the reflected light incident on a pixel of an image. In detail, the quantity change detection unit 110 may detect a change in intensity related to the motion of the object 102, using a determination of whether light incident on a pixel from the surrounding, i.e. other than the reflected light, is interrupted by the object 102.

For example, when the object is moved from a position A to a position B, the light received by the quantity change detection unit 110 may be interrupted by the object located in the position B. Therefore, the intensity of light incident on a pixel corresponding to the position B may be reduced. When the object is moved from the position B to the position A, since the object is absent in the position B, the intensity of the light incident on the pixel corresponding to the position B may be increased. Thus, the intensity of light received by pixels of the image may vary over time according to a motion of the object.

In summary, when the light source 101 changes the quantity of the output light, the quantity change detection unit 110 may detect a change in the quantity of the reflected light. In addition, the proximity determination unit 120 may determine the proximity of an object using the change in the quantity of the reflected light. When the light source 101 does not output light, the quantity change detection unit 110 may detect a change in the quantity of received light related to a motion of the object, and the motion recognition unit 130 may recognize the motion of the object 102 using the change in quantity related to the motion.

The quantity change detection unit 110 may be a temporal contrast optical sensor adapted to detect the change in the quantity of the light incident on the pixel of the image and thereby output events.

The temporal contrast optical sensor may output an "on event" when the quantity of light incident to the pixel of the image is increased, and may output an "off event" when the quantity of light incident on the pixel of the image is decreased. In addition, the temporal contrast optical sensor may operate asynchronously without a frame, and may have time resolution of about 10 micro seconds (μs) or less.

The proximity determination unit 120 may determine the proximity of the object using the quantity change determined and the events output by the quantity change detection unit 110. The events output by the quantity change detection unit 110 may be events based on the determined quantity change. A number of the events output by the quantity change detection unit 110 may be an occurrence number of the events based on the determined quantity change.

The number of events output by the quantity change detection unit 110 may be inversely proportional to the distance between the object 102 and the proximity sensor 100. That is, the proximity determination unit 120 may estimate the distance between the object 102 and the proximity sensor 100 using the number of the events output by the quantity change detection unit 110. Here, the proximity determination unit 120 may determine that the object 120 is approaching the proximity sensor 100 when the distance between the object 102 and the proximity sensor 100 is less than a reference value.

The proximity determination unit 120 may determine the proximity of the object 102 using the number of the events output by the quantity change detection unit 110 within a predetermined time beginning at a time when the intensity change of the output light occurs. The predetermined time may be duration from the time when the intensity change of the output light occurs to a time when a next intensity change of the output light occurs.

When the change in the intensity of the output light occurs, the quantity change detection unit 110 may detect the quantity change according to the output light of which the intensity has been changed, and the distance between the object 102 and the proximity sensor 100.

In addition, the quantity change detection unit 110 may detect only whether the quantity has been changed, rather than a value of the quantity. Therefore, when no additional change occurs in the intensity of the output light after the quantity change of the output light occurs, the quantity change detected by the quantity change detection unit 110 may be reduced as time passes. Therefore, the number of the events output by the quantity change detection unit 110 may be higher closer to the time when the quantity change of the output light occurs. That is, events output by the quantity change detection unit 110 after the predetermined time measured from the time when the quantity change of the output light occurs may be less related to the distance between the object 102 and the proximity sensor 100.

Thus, the proximity determination unit 120 may use the number of only those events which fall within the predetermined time from the time when the intensity of the output light occurs, in determining the proximity of the object 102. Accordingly, the events less related to the distance between the object 102 and the proximity sensor 100 may be prevented from being used for the determination of proximity of the object 102.

A process of determining proximity of the object 102 using the number of the events determined by the proximity determination unit 120 will be described in detail with reference to FIG. 4.

The proximity determination unit 120 may determine proximity of the object using a temporal distribution pattern of events based on the determined quantity change and the time when the intensity change of the output light occurs.

When the intensity change is detected, the quantity change detection unit 110 may detect the quantity change of the reflected light, the intensity of which has changed after the passage of the predetermined time. Here, the predetermined time may be a sum of a time during which the output light with the changed intensity moves to the object 102 and a time during which the reflected light reflected from the object 102 moves to the quantity change detection unit 110.

Therefore, the number of the events output by the quantity change detection unit 110 may be maximized when the predetermined time has elapsed from the time when the intensity change of the output light occurs. Also, the predetermined time may be determined according to the distance between the proximity sensor 100 and the object 102. Therefore, the proximity determination unit 120 may determine the distance between the proximity sensor 100 and the object 102 using a difference between the time when the number of the output events is maximized and the time when the intensity change of the output light occurs in the temporal distribution pattern.

A process of determining proximity of the object 102 using the temporal distribution pattern by the proximity determination unit 120 will be described in detail with reference to FIG. 5.

The proximity determination unit 120 may determine proximity of the object 102 when the light source 101 output light with a changing intensity. Therefore, the proximity determination unit 120 may confirm whether the light source 101 is operational and may operate when the light source 101 is operational. When the light source 101 is not in operation, the proximity determination unit 120 may not operate but may operate the motion recognition unit 130.

The motion recognition unit 130 may recognize the motion of the object 102 using the quantity change detected by the quantity change detection unit 110. Here, the motion of the object 102 may include at least one of a number of movements of the object 102 within a detection range of the quantity change detection unit 110, and a movement direction.

The motion recognition unit 130 may recognize the motion of the object 102 using the number of the events output by the quantity change detection unit 110. Here, the number of the events output by the quantity change detection unit 110 may correspond to the number of movements of the object 102 within the detection range of the quantity change detection unit 110.

In addition, the motion recognition unit 130 may detect the operation of the object 102 using a number of cases in which the number of the events output by the quantity change detection unit 110 exceeds a reference value.

When the light source 101 does not output the output light, the quantity change detection unit 110 may detect quantity of the surrounding light incident to the pixels. Therefore, events unexpected by the user may occur according to a movement of the proximity sensor 100. The events occurring herein may not be events intentionally generated by the user to control the operation of the proximity sensor 100.

Therefore, when the number of the events output by the quantity change detection unit 110 exceeds the reference value, the motion recognition unit 130 may determine the events as events intentionally input by the user, and may recognize the motion of the object 102 based on the events. Here, the reference value may be a number of times used for determining whether the output events of the quantity change detection unit 110 are events intentionally generated by the user. Therefore, the reference value may be determined by a motion corresponding to a motion mode.

When the number of the events output by the quantity change detection unit 110 for the predetermined time exceeds the reference value, the motion recognition unit 130 may count the number of excesses, and recognize the motion of the object 102 using the number of excesses.

In addition, the motion recognition unit 130 may recognize the motion of the object 102 using an occurrence interval of the events based on the quantity change. For example, when the user moves the object 102 according to a predetermined pattern, intervals at which the quantity change detection unit 110 outputs events may form a predetermined pattern. Accordingly, the motion recognition unit 130 may recognize the motion of the object 102 using the occurrence interval of the events based on the quantity change. Here, the motion recognition unit 130 may recognize the motion of the unit 102 using intervals of times when the number of the output events of the quantity change detection unit 110 exceeds the reference value.

Furthermore, the motion recognition unit 130 may recognize the motion of the object 102 using a direction of the events based on the quantity change. In detail, the motion recognition unit 130 may recognize a direction of the motion of the object 102, using positions or movement directions of pixels of which the quantity change is detected by the quantity change detection unit 110 among pixels of continuous images. For example, when the number of the output events of the quantity change detection unit 110 exceeds the reference value, the motion recognition unit 130 may recognize a direction of the motion of the object 102 based on the movement directions of the corresponding pixels in the continuous images.

Also, the motion recognition unit 130 may recognize the motion of the object 102 according to output positions of the on events and the off events. In detail, the motion recognition unit 130 may recognize the motion of the object 102 using a movement of the object 102 from an on event output position to an off event output position.

FIG. 2 is a diagram illustrating an operational process of the proximity sensor 100 according to an exemplary embodiment.

First, the light source 101 may output an output light 210 having a relatively high intensity as in a case 1. Here, the proximity sensor 100 may receive a reflected light 211 which is the output light 210 reflected from the object 120. Accordingly, the quantity measured by the quantity change detection unit 110 of the proximity sensor 100 may include quantity of surrounding light being incident to pixels and quantity of the reflected light 211. That is, the quantity change detection unit 110 of the proximity sensor 100 may measure an increase of quantity as much as the quantity of the reflected light 211. The proximity determination unit 120 of the proximity sensor 100 may determine the distance between the object 102 and the proximity sensor 100 using the increase of the quantity of the reflected light 211.

However, when the light source 101 continues output of the output light 210 having the high intensity as in the case 1 for a predetermined time, the quantity of the reflected light 211 may not change. In this case, since the quantity change detection unit 110 may not detect the quantity change, the proximity sensor 100 may not be able to determine the distance between the object 102 and the proximity sensor 100.

Accordingly, when the light source 101 outputs the output light 210 having the high intensity as in the case 1 for the predetermined time, the light source 101 may change the output intensity and output an output light 220 having a relatively low intensity as in a case 2. Here, the proximity sensor 100 may receive a reflected light 221 which is the output light 220 reflected from the object 102. Therefore, the quantity change detection unit 110 may detect a decrease in the quantity of the reflected light 221 in comparison to the quantity of the reflected light 211. In addition, the proximity determination unit 120 of the proximity sensor 100 may determine the distance between the object 102 and the proximity sensor 100 using the decrease of the quantity of the reflected light 221.

When the distance 101 continues output of the output light 220 having the low intensity as in the case 2 for a predetermined time, the light source 101 may change the output intensity and output the output light 210 having the high intensity as in the case 1. Here, the proximity sensor 100 may receive the reflected light 211 which is the output light 210 reflected by the object 102. Accordingly, the quantity change detection unit 110 may detect an increase of the quantity of the reflected light 211 in comparison to the quantity of the reflected light 221. In addition, the proximity determination unit 120 of the proximity sensor 100 may distance the distance between the object 102 and the proximity sensor 100 using the increase of the quantity of the reflected light 211.

That is, the proximity sensor 100 according to this exemplary embodiment may determine proximity of the object 102 by the quantity change detection unit 110 based on the light source 101 varying the intensity of the output light.

FIG. 3 is a diagram illustrating operational processes according to a distance between the proximity sensor 100 and the object 102, according to an exemplary embodiment.

The distance between the proximity sensor 100 and the object 102 may be divided into a short distance as in the case 1, an intermediate distance as in the case 2, and a long distance as in a case 3.

When the distance is short as in the case 1, the proximity sensor 100 may receive a reflected light 311 which is an output light 310 reflected from the object 102. In this case, the proximity sensor 100 may fully receive the reflected light 311 of the output light 310 as shown in FIG. 3. Therefore, a range of the quantity change of the reflected light 311 detected by the quantity change detection unit 110 may correspond to a range of the quantity change of the output light 310.

When the distance is intermediate as in the case 2, the proximity sensor 100 may partially receive the reflected light 321 of the output light 320 as shown in FIG. 3. Therefore, a range of the quantity change of the reflected light 321 detected by the quantity change detection unit 110 may be smaller than a range of the intensity change of the output light 320.

When the distance is long as in the case 3, the output light 330 output by the light source 101 may be almost not reflected by the object 102. In this case, a range of the quantity change detected by the quantity change detection unit 110 may be a temporal quantity of light irrelevant to the output light 330. Therefore, the quantity change detected by the quantity change detection unit 110 may not correspond to the intensity change of the output light 330

Figure 4:
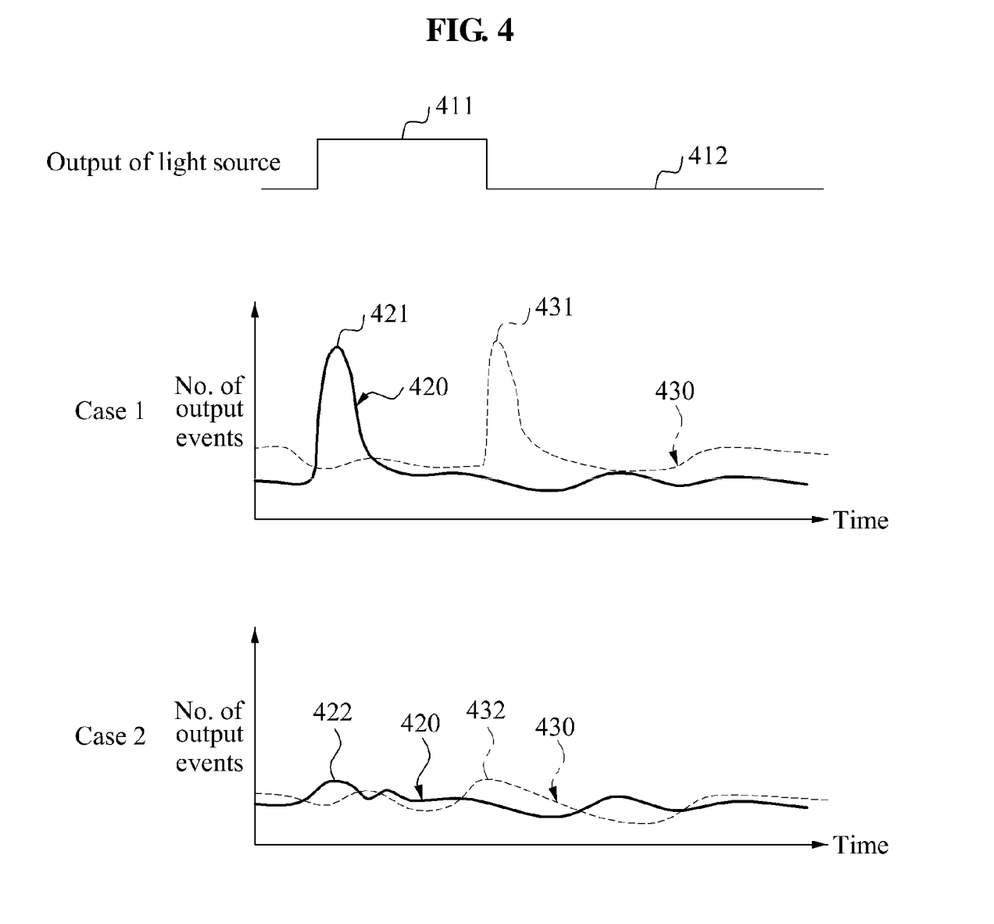
FIG. 4 is a diagram illustrating processes of detecting proximity of an object using a number of events output by a quantity change detection unit, according to an exemplary embodiment.

FIG. 4 is a diagram illustrating processes of detecting the proximity of an object using a number of events output by the quantity change detection unit 110, according to an exemplary embodiment.

The light source 101 according to this exemplary embodiment may change the intensity of the output light between high 411 and low 412 as shown in FIG. 4.

When the distance between the proximity sensor 100 and the object 102 is relatively short as in the case 1, the quantity of the reflected light may correspond to the intensity of the output light.

Therefore, when the light source 101 changes the intensity of the output light to the high 411, the quantity change detection unit 110 may detect the increase of the quantity of the reflected light and output a plurality of events 421. The events 421 output by the quantity change detection unit 110 may be on events 420 indicating the increase of the quantity of the reflected light. While the light source 101 is outputting the output light with the intensity set to high 411, the quantity of the reflected light may not be further increased. Therefore, the quantity change detection unit 110 may reduce a number of the on events 420 being output as time elapses. Here, the proximity determination unit 120 may determine the distance between the proximity sensor 100 and the object 102 using the number of the events 421 output by the quantity change detection unit 110 and a temporal distribution pattern of the on events 420.

In addition, when the light source 101 changes the intensity of the output light from high 411 to low 412 after a predetermined time has elapsed, the quantity change detection unit 110 of the proximity sensor 100 may detect a decrease in the quantity of the reflected light and may output a plurality of events 431. The events 431 output by the quantity change detection unit 110 may be off events 430 indicating the decrease in the quantity of the reflected light.

That is, when the distance between the proximity sensor 100 and the object 102 is relatively short as in the case 1, the quantity change detection unit 110 may output a plurality of events when the light source 101 changes the intensity of the output light to the high 411 and when the light source 101 changes the intensity of the output light to the low 412.

Conversely, when the distance between the proximity sensor 100 and the object 102 is relatively long as in the case 2, the proximity sensor 100 may receive less reflected light as in the case 2 or the case 3 shown in FIG. 3.

Therefore, although the light source 101 changes the intensity of the output light to the high 411, the quantity change of the reflected light may be small. Accordingly, the quantity change detection unit 110 may output a small number of events 422 according to the quantity change of the reflected light. Here, the number of the events 422 output by the quantity change detection unit 110 may be smaller than the number of the events 421.

In addition, although the light source 101 changes the intensity of the output light from the high 411 to the low 412 in a predetermined time, the quantity change of the reflected light may be small. Therefore, the quantity change detection unit 110 may output events 432 of a smaller number than in the case 1 according to the quantity change of the reflected light. The number of the events 432 output by the quantity change detection unit 110 may be smaller than the number of the events 431.

That is, when the distance between the proximity sensor 100 and the object 102 is relatively long as in the case 2, the time when the light source 101 changes the intensity of the output light may be less relevant to the time when the quantity change detection unit 110 outputs the events.

Therefore, the proximity sensor 100 may determine the distance between the proximity sensor 100 and the object 102 using relations between the time when the light source 101 changes the intensity of the output light and the time when the quantity change detection unit 110 outputs the plurality of events.

Figure 5:
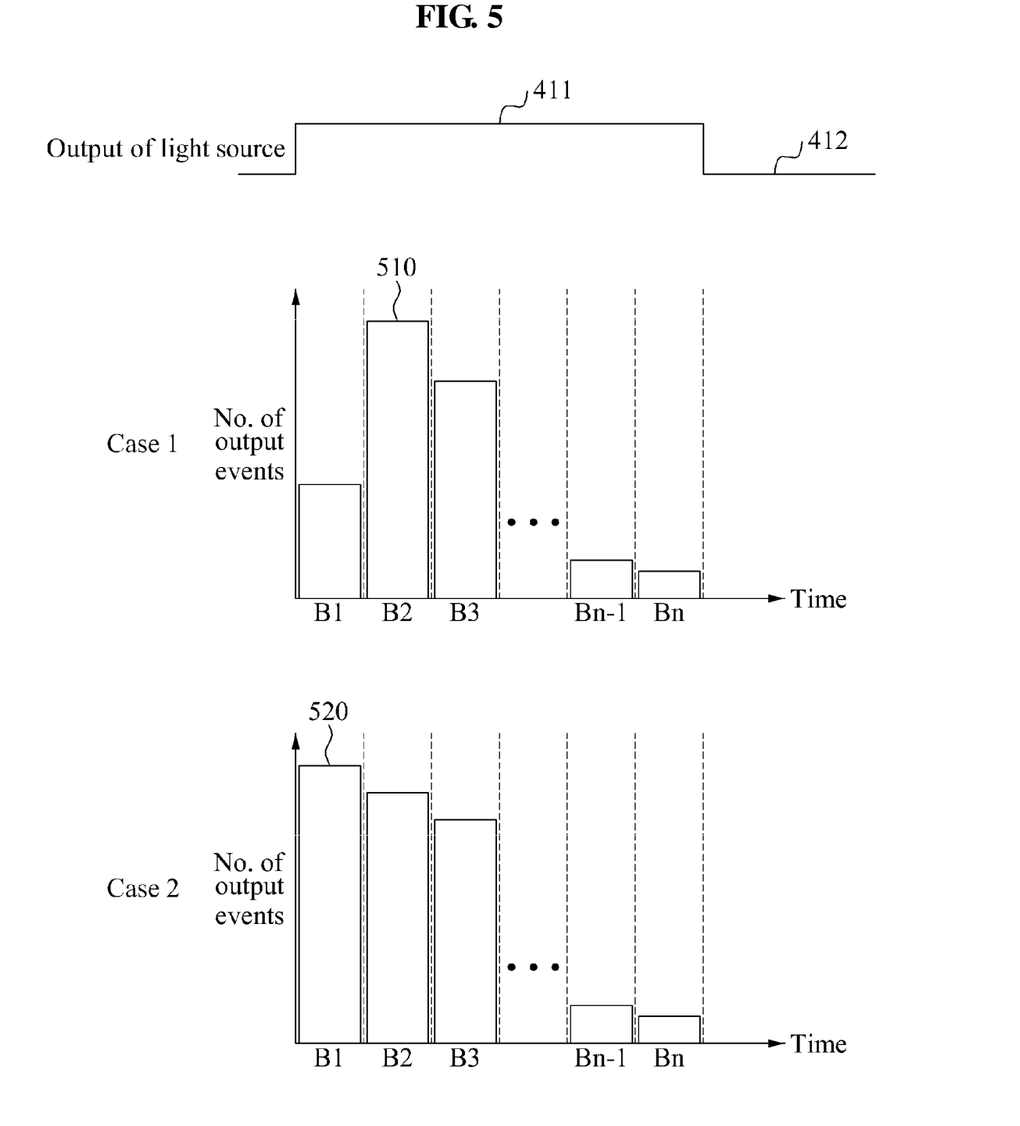
FIG. 5 is a diagram illustrating processes of detecting proximity of an object using a temporal distribution pattern of events output by a quantity change detection unit, according to an exemplary embodiment.

FIG. 5 is a diagram illustrating processes of detecting proximity of the object 102 using a temporal distribution pattern of events output by the quantity change detection unit 110, according to an exemplary embodiment.

When the distance between the proximity sensor 100 and the object 102 is relatively short so that the quantity of the reflected light corresponds to the intensity of the output light, the proximity sensor 100 according to the exemplary embodiment may determine the distance using a temporal distribution pattern of events.

When the intensity change of the output light occurs, the quantity change detection unit 110 may detect the quantity change of the reflected light which is the output light reflected from the object 102, the output light of which the intensity has been changed after the predetermined time passes. Here, the predetermined time may be a sum of a time during which the output light with the changed intensity moves to the object 102 and a time during which the reflected light reflected from the object 102 moves to the quantity change detection unit 110.

In addition, the predetermined time corresponding to the reflected light may be respectively different according to a shape of the object 102. For example, when the object 102 has a portion which protrudes toward the proximity sensor 100, the proximity sensor 100 may receive a reflected light reflected from the protruding portion earlier than a reflected light reflected from other portions. That is, since the proximity sensor 100 may receive the reflected light at different times according to the shape of the object 102, events output by the quantity change detection unit 110 may form a predetermined pattern according to time.

Here, the reflected light reflected by a main body of the object 102 may occupy a large portion of the entire reflected light. Therefore, the number of the events output by the quantity change detection unit 110 may be maximized at the time when the reflected light reflected from the object 102 is received. Accordingly, the proximity determination unit 120 may distance the distance between the proximity sensor 100 and the object 102 using a difference between the time when the number of the output events is maximized and the time when the intensity change of the output light occurs in the temporal distribution pattern.

For example, when B2 denotes a time 510 when the number of the events is maximized as in the case 1, the proximity determination unit 120 may determine the distance using a difference between the time when the light source 101 changes the intensity of the output light to the high 411 and the time B2. When B1 denotes a time 520 when the number of events is maximized as in the case 2, the proximity determination unit 120 may determine the distance using a difference between the time when the light source 101 changes the intensity of the output light to the high 411 and the time B1.

When the temporal distribution pattern of the events is changed from the case 1 to the case 2, the proximity determination unit 120 may determine that the object 102 is moved toward the proximity sensor 100 because the difference between the time 520 and the time when the light source 101 changes the intensity of the output light to the high 411 is reduced.

Figure 6:
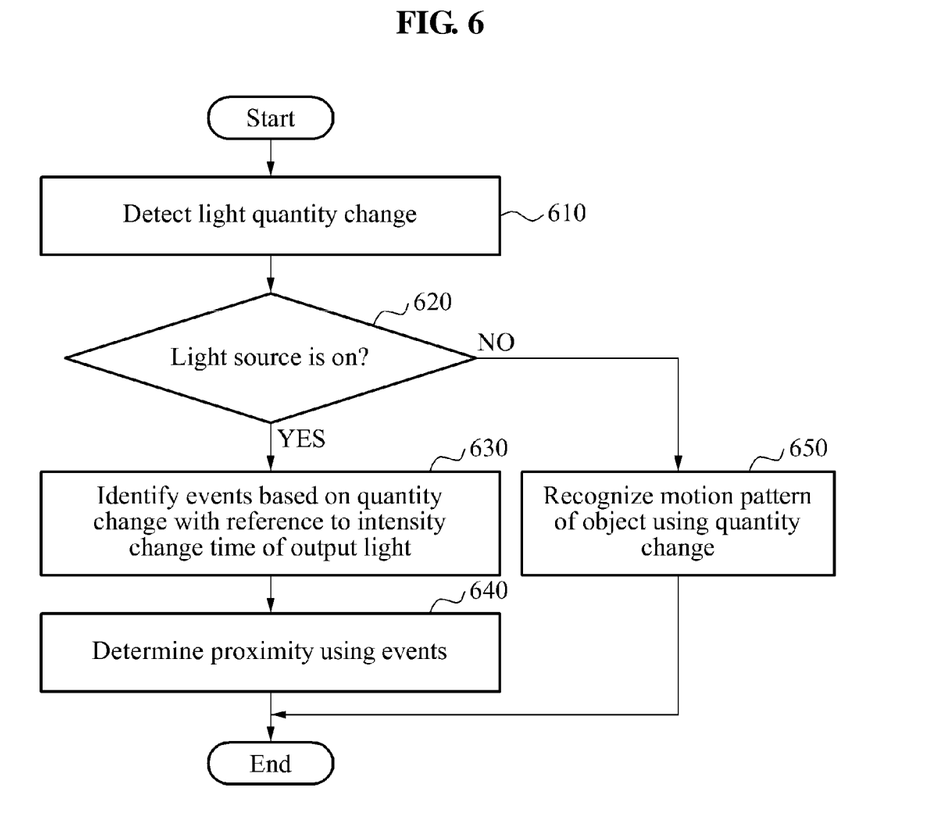
FIG. 6 is a diagram illustrating a proximity sensing method of a proximity sensor, according to an exemplary embodiment.

FIG. 6 is a diagram illustrating a proximity sensing method of a proximity sensor, according to an exemplary embodiment.

In operation 610, the quantity change detection unit 110 may detect the quantity change in the light received by the proximity sensor 100. Here, the quantity change may be a quantity change of the output light of the light source 101 as reflected from the object 102, or a quantity change related to motions of the object 102. Also, the quantity change detection unit 110 may output events based on the quantity change.

In operation 620, the proximity determination unit 120 may determine whether the light source 101 operates. In detail, when the light source 101 outputs an output light of which intensity changes, the proximity determination unit 120 may determine the light source 101 is on.

When the light source 101 is determined to be operating in operation 620, the proximity determination unit 120 may determine the quantity change detected in operation 610 as a quantity change of the output light and perform operation 630. When the light source 101 is determined to be not operating in operation 620, the proximity determination unit 120 may determine the quantity change detected in operation 610 as a quantity change related to the motions of the object 102, and perform operation 650 by driving the motion recognition unit 130.

In operation 630, the proximity determination unit 120 may identify events output for a predetermined time from the time when the intensity change of the output light occurs among the events output in operation 610. Here, the predetermined time may be duration from the time when the intensity change of the output light occurs to a time when a next intensity change of the output light occurs.

In operation 640, the proximity determination unit 120 may determine proximity of the object 102 using the events identified in operation 630. In detail, the proximity determination unit 120 may determine the proximity using the number of the events identified in operation 630 and the temporal distribution pattern of the events identified in operation 630.

In operation 650, the motion recognition unit 130 may recognize the motions of the object 102 using the quantity change detected in operation 610.

Here, the motion recognition unit 130 may recognize the motions of the object 102 using at least one of a number of the events output in operation 610, an occurrence interval of the events, an occurrence direction of the events, and a type of the events.

The above-described exemplary embodiments may be recorded on non-transitory computer-readable media including program instructions to implement various operations embodied by a computer. The media may also include, alone or in combination with the program instructions, data files, data structures, and the like. Examples of non-transitory computer-readable media include magnetic media such as hard disks, floppy disks, and magnetic tape; optical media such as CD ROM disks and DVDs; magneto-optical media such as optical disks; and hardware devices that are specially configured to store and perform program instructions, such as read-only memory (ROM), random access memory (RAM), flash memory, and the like. Examples of program instructions include both machine code, such as produced by a compiler, and files containing higher level code that may be executed by the computer using an interpreter. The described hardware devices may be configured to act as one or more software modules in order to perform the operations of the above-described exemplary embodiments, or vice versa.

A number of exemplary embodiments have been described above. Nevertheless, it should be understood that various modifications may be made. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A proximity sensor comprising:
    a light source which varies an intensity of output light over time;
    a quantity change detection unit which measures an increase or decrease in a quantity of light incident to pixels, and outputs a number of on events or off events respectively based on the increase or decrease in the quantity of the light incident to the pixels, each of the number of on events corresponding to a respective pixel among the pixels at which the quantity of light incident to the respective pixel is increased and each of the number of off events corresponding to a respective pixel among the pixels at which the quantity of light incident to the respective pixel is decreased; and
    a proximity determination unit which uses an occurrence number of the on events or the off events to determine a proximity of an object,
    wherein the output light is reflected by the object and is incident to the pixels.

2. The proximity sensor of claim 1, wherein the on events or the off events correspond to the change detected in the quantity of the light incident to the pixels during a predetermined time measured from a time when the change in intensity of the output light occurs.

3. The proximity sensor of claim 1, wherein the proximity determination unit determines the proximity of the object further based on a temporal distribution pattern of the on events or the off events.

4. The proximity sensor of claim 1, wherein the proximity determination unit determines the proximity of the object using a difference between a time when the number of the on events or the off events is maximized and a time when the change in the intensity of the output light occurs.

5. The proximity sensor of claim 1, wherein the quantity change detection unit detects a change in a quantity of environmental light incident on the pixels when the light source does not output the output light, wherein the on events or the off events correspond to the change in the quantity of the environmental light incident on the pixels,
    wherein an intensity of the environmental light varies over time according to a motion of the object, and
    wherein the environmental light is different from the output light from the light source and the incident light corresponding to the output light.

6. The proximity sensor of claim 5, further comprising a motion recognition unit which recognizes the motion of the object using the change in the quantity of the environmental light related to the motion of the object.

7. The proximity sensor of claim 6, wherein the motion recognition unit recognizes the motion of the object using the number of the on events or the off events.

8. The proximity sensor of claim 6, wherein the motion recognition unit recognizes the motion of the object using an interval of the on events or the off events.

9. The proximity sensor of claim 6, wherein the motion recognition unit recognizes the motion of the object using an occurrence direction of the on events or the off events.

10. The proximity sensor of claim 6, wherein the motion recognition unit recognizes the motion of the object using a type of the on events or the off events, each of the on events or off events corresponding to a change in the quantity of the environmental light incident to a pixel in an image including the object related to the motion of the object.

11. A proximity sensing method comprising:
    varying an intensity of output light over time;
    measuring an increase or decrease in a quantity of light incident to pixels;
    determining an occurrence number corresponding to a number of on events or off events respectively based on the increase or decrease in the quantity of the light incident to the pixels, each of the number of on events corresponding to a respective pixel among the pixels at which the quantity of light incident to the respective pixel is increased and each of the number of off events corresponding to a respective pixel among the pixels at which the quantity of light incident to the respective pixel is decreased: and
    determining a proximity of an object using the occurrence number of the on events or the off events,
    wherein the output light is reflected by the object and is incident to the pixels.

12. The proximity sensing method of claim 11, wherein the on events or the off events correspond to the change detected in the quantity of the light incident to the pixels during a predetermined time measured from a time when the change in intensity of the output light occurs.

13. The proximity sensing method of claim 11, wherein the determining comprises determining the proximity of the object further based on a temporal distribution pattern of the on events or the off events.

14. The proximity sensing method of claim 11, wherein the determining comprises determining the proximity of the object using a difference between a time when the number of the on events or the off events is maximized and a time when the change in the intensity of the output light occurs.

15. The proximity sensing method of claim 11, further comprising detecting a change in a quantity of environmental light incident on the pixels when a light source does not output the output light, wherein the on events or the off events correspond to the change in the quantity of the environmental light incident on the pixels,
    wherein an intensity of the environmental light varies over time according to a motion of the object, and
    wherein the environmental light is different from the output light from the light source and the incident light corresponding to the output light.

16. The proximity sensing method of claim 15, further comprising recognizing the motion of the object using the change in the quantity of the environmental light related to the motion of the object.

17. The proximity sensing method of claim 16, wherein the recognizing comprises recognizing the motion of the object using the number of the on events or the off events.

18. The proximity sensing method of claim 16, wherein the recognizing comprises recognizing the motion of the object using an interval of the on events or the off events.

19. The proximity sensing method of claim 16, wherein the recognizing comprises recognizing the motion of the object using an occurrence direction of the on events or the off events.

20. The proximity sensing method of claim 16, wherein the recognizing comprises recognizing the motion of the object using a type of the on events or the off events.

21. A non-transitory computer readable recording medium storing a program to cause a computer to execute a method comprising:
    varying an intensity of output light over time;
    receiving a number of on events or off events respectively based on an increase or decrease in a quantity of light incident to pixels;
    each of the number of on events corresponding to a respective pixel among the pixels at which the quantity of light incident to the respective pixel is increased and each of the number of off events corresponding to a respective pixel among the pixels at which the quantity of light incident to the respective pixel is decreased;
    determining an occurrence number corresponding to the number of the on events or the off events; and
    determining a proximity of an object using the occurrence number of on the events or the off events,
    wherein the output light is reflected by the object and is incident to the pixels.

22. The proximity sensor of claim 1, wherein the proximity determination unit determines the proximity of the object using a relationship between the time when the light source changes the intensity of the output light and a time when the on events or the off events are detected.

23. The proximity sensor of claim 22, wherein the proximity determination unit determines the proximity of the object by measuring a difference between the time when the light source changes the intensity of the output light and a time when the number of the on events or the off events is at a maximum during a predetermined time after the change in the intensity of the output light occurs.

24. The proximity sensor of claim 6, wherein the motion recognition unit determines when the on events or off events exceed a reference value, counts an excess number based on a number of the on events or the off events that exceed the reference value and determines the the motion of the object using the excess number.

* * * * *